United States Patent
Green

(10) Patent No.: US 7,511,493 B2
(45) Date of Patent: Mar. 31, 2009

(54) MAGNETIC RESONANCE IMAGING METHOD AND APPARATUS

(75) Inventor: Jordin D. Green, Calgary (CA)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/739,799

(22) Filed: Apr. 25, 2007

(65) Prior Publication Data

US 2008/0265886 A1    Oct. 30, 2008

(51) Int. Cl.
*G01V 3/00*    (2006.01)
(52) U.S. Cl. ........................ 324/309; 324/307
(58) Field of Classification Search ................. 324/309, 324/307; 600/410
See application file for complete search history.

(56) References Cited

U.S. PATENT DOCUMENTS 5,420,510 A * 5/1995 Fairbanks et al. ........... 324/309
7,254,435 B2 * 8/2007 Zhang et al. ................ 600/410

OTHER PUBLICATIONS

"Delayed Enhancement and T2-Weighted Cardiovascular Magnetic Resonance Imaging Differentiate Acute From Chronic Myocardial Infarction," Abdel-Aty et al, Circulation, vol. 109 (2004) pp. 2411-2416.

"Blood-Oxygen Level-Dependent (BOLD) Magnetic Resonance Imaging in Patients With Stress-Induced Angina," Friedrich et al, Circulation, vol. 108 (2003), pp. 2219-2223.

"T2-Prepared Steady-State Free Precession Blood Oxygen Level-Dependent MR Imaging of Myocardial Perfusion in a Dog Stenosis Model," Shea et al, Radiology, vol. 236 (2005) pp. 503-509.

"Coronary Angiography with Magnetization-Prepared T2," Brittain et al, Mag. Res. In Med., vol. 33 (1995) pp. 689-696.

* cited by examiner

*Primary Examiner*—Louis M Arana
(74) *Attorney, Agent, or Firm*—Schiff Hardin LLP

(57) ABSTRACT

In a magnetic resonance imaging (MRI) method, in the form of an MRI pulse sequence, and an apparatus for acquiring MRI data from an object, a contrast preparation module is applied to the object for preparing a contrast in the magnetization of nuclear spins of the object, and an imaging module is applied to the object after the contrast preparation module for acquisition of magnetic resonance image data reflecting the prepared contrast. The contrast preparation module includes a train of radio-frequency pulses with the same flip angle magnitude α, the respective signs of the flip angles alternating from radio-frequency pulse to radio-frequency pulse.

22 Claims, 2 Drawing Sheets

MAGNETIC RESONANCE IMAGING METHOD AND APPARATUS

BACKGROUND OF THE INVENTION

1. Field of the Invention

The present invention relates to a magnetic resonance imaging (MRI) method in the form of a pulse sequence, as well as to an MRI apparatus of the type suitable for medical imaging.

The present invention relates to the field of magnetic resonance imaging (MRI) as used in medicine for examination of patients. In particular, the present invention relates to a MRI pulse sequence and to a MRI apparatus suitable for cardiac imaging, particularly for imaging and diagnosing acute infarct patients and patients with myocardial ischemia.

2. Description of the Prior Art

MRI is based on the physical phenomenon of nuclear magnetic resonance and has been successfully used as an imaging method for over several decades inter alia in medicine and biophysics, as well as other fields.

In this examination modality, a subject is exposed to a strong, constant basic magnetic field (often called the B0 field). The nuclear spins of the atoms in the subject which were previously randomly oriented, thereby align. Radio-frequency energy, e.g. radio-frequency pulses, can excite these "ordered" nuclear spins to a specific oscillation, i.e. a precession around the main magnetic field. This oscillation generates a signal that can be detected by appropriate reception coils. By the use of non-homogeneous magnetic fields generated by gradient coils, the signals can be spatially coded in all three spatial directions. The acquired signal can be digitized. A so-called multidimensional k-space matrix is filled with the digitized complex values of the measurement signal. A corresponding magnetic resonance image is generated from the k-space matrix by means of a complex Fourier transformation.

Recently, MRI has been used for cardiac imaging. The detection of cardiac edemas, i.e. essentially the accumulation of water in heart muscle, has turned out to be useful for the identification of acute infarct patients.

Additionally, blood oxygen level-dependent (BOLD) MR imaging, which is known for obtaining MR data from the brain, has been proposed for cardiac imaging. This technique relies on the endogenous contrast mechanism of oxyhemoglobin and deoxyhemoglobin, respectively. In cardiac imaging this BOLD contrast can be used for identifying myocardial ischemia.

The publication of Abdel-Aty et al., "Delayed enhancement and T2-weighted cardiovascular magnetic resonance imaging differentiate acute from chronic myocardial infarction", Circulation 2004, 109, 2411-2416, discloses a delayed enhancement and T2-weighted cardiovascular magnetic resonance imaging method for detecting acute and chronic myocardial infarction.

The publication of Friedrich et al., "Blood-Oxygen-Level-Dependent (BOLD) Magnetic Resonance Imaging in Patients with Stress-induced Angina", Circulation 2003, 108, 2219-2223 discloses a BOLD-MRI-sequence T2*-sensitive echo planar imaging sequence for detecting myocardial ischemia using BOLD contrast, The publication of Shea et al., "T2-prepared steady-state free precession blood oxygen level-dependent MR imaging of myocardial perfusion in a dog stenosis model", Radiology 2005, 236, 503-509, describes a MRI sequence used for myocardial perfusion imaging.

The publication of Brittain et al., "Coronary angiography with magnetization-prepared T2", Magn. Reson. Med. 1995, 33, 689-696, discloses a MRI pulse sequence with a T2-weighted magnetization preparation.

However, there is still a need for improving MRI sequences regarding artifact sensitivity, motion sensitivity and T2-sensitivity.

SUMMARY OF THE INVENTION

An object of the invention is to provide an MRI method in the form of a pulse sequence, and a MRI apparatus that are particularly useful for cardiac imaging, which allow magnetic resonance image data acquisition with a good and adjustable T2-sensitivity, as is particularly useful for cardiac imaging.

This object is achieved in accordance with the present invention by a method for acquiring magnetic resonance image data from an object, by applying an MRI pulse sequence in the following steps:

a) applying a contrast preparation module for preparing a contrast in the magnetization of nuclear spins of the object, b) applying an imaging module succeeding the contrast preparation module for acquisition of magnetic resonance image data reflecting the prepared contrast, wherein the contrast preparation module includes a train of radio-frequency pulses with the same flip angle magnitude $\alpha$, the respective signs of the flip angles alternating from radio-frequency pulse to radio-frequency pulse.

In other words, all the radio-frequency pulses of the train of radio-frequency pulses have a flip angle with the same magnitude, the sign of the flip angle alternating from radio-frequency pulse to radio-frequency pulse.

An MRI image reconstructed from magnetic resonance image data acquired with such a sequence reflects the contrast prepared with the contrast preparation module. The contrast preparation module as described above induces a contrast according to a steady-state free precession scheme. The induced contrast is usually T2/T1-weighted.

Therefore, a MR image reconstructed from the acquired magnetic resonance image data exhibits a T2/T1-weighted contrast. Such a contrast is particularly useful for BOLD imaging. The MRI pulse sequence also allows for an easy adjustment of the BOLD sensitivity, e.g. by varying the flip angle.

In an embodiment of the MRI pulse sequence the flip angle of the radio-frequency pulses is different from 180°. The flip angle $\alpha$ can for example be varied within a of 20° to 150°, even more particular within a range of 40° to 120°, and even more particular within range of 60° to 90°.

The radio-frequency pulses are especially equally spaced in time, for example with a constant time interval $TR_P$ between two successive radio-frequency pulses. A variation of the time interval $TR_P$ allows also varying the contrast.

In a further embodiment of the MRI pulse sequence, said train of radio-frequency pulses is preceded by a first radio-frequency pulse. The first radio-frequency pulse can be used to reduce off-resonance effects. For example, the first radio-frequency pulse can have a first flip angle of $\alpha/2$.

In a further embodiment, the train of radio-frequency pulses is succeeded by a flip back radio-frequency pulse. The flip back radio-frequency pulse is used for flipping the magnetization back along the longitudinal axis, i.e. along the direction of the main magnetic field. This can be achieved for example by applying the flip back radio-frequency pulse with a flip angle of $\alpha/2$.

In a further embodiment, the train of radio-frequency pulses is succeeded by a spoiler gradient. Such a spoiler gradient destroys the remaining transverse magnetization, improving the quality of the succeeding the image data acquisition.

In a further embodiment, the contrast preparation module of step a) is applied to a first slice with a first thickness and the imaging module of step b) is applied to a second slice with a second thickness, the second thickness being smaller than the first thickness and the second slice being contained in the first slice. Alternatively, the contrast preparation module of step a) can be applied in a non-selective manner.

With these embodiments the contrast preparation is performed on the larger region than the slice the image data are acquired from. This reduces artifacts caused by nuclear spins inflowing into the slice the image data are acquired from.

In a further embodiment, the imaging module of step b) of the MRI pulse sequence comprises a steady-state free precession data acquisition scheme. These sequence is less susceptible to susceptibility artifacts compared with an echo-planar-imaging (EPI) based sequence. Furthermore, the imaging module of step b) can comprise a train of dummy radio-frequency pulses prior to the acquisition of magnetic resonance image data. The flip angles of the radio-frequency pulses of the train of dummy pulses can be linearly increasing. This reduces off resonance effects leading to a better image quality in a reconstructed image.

In a further embodiment of the MRI pulse sequence, a block comprising step a) and step b) is repeated several times. This allows for example for a segmented magnetic resonance data acquisition. Each time step b) is applied MRI data belonging to a different k-space segment can be sampled, until all the necessary MRI data for image reconstruction are fully acquired. This embodiment is particularly useful in cardiac imaging, where due to cardiac motion image data acquisition is only possible within a limited time period during a cardiac cycle. Repeating the block of step a) and step b) allows splitting up image data acquisition over several cardiac cycles.

In such a case, the block comprising step a) and step b) can be triggered by an echocardiography signal in order to adapt the MRI pulse sequence to the cardiac motion.

The above object is achieved by an MRI apparatus configured to apply an MRI pulse as described above.

DESCRIPTION OF THE PREFERRED EMBODIMENTS

Figure 1:
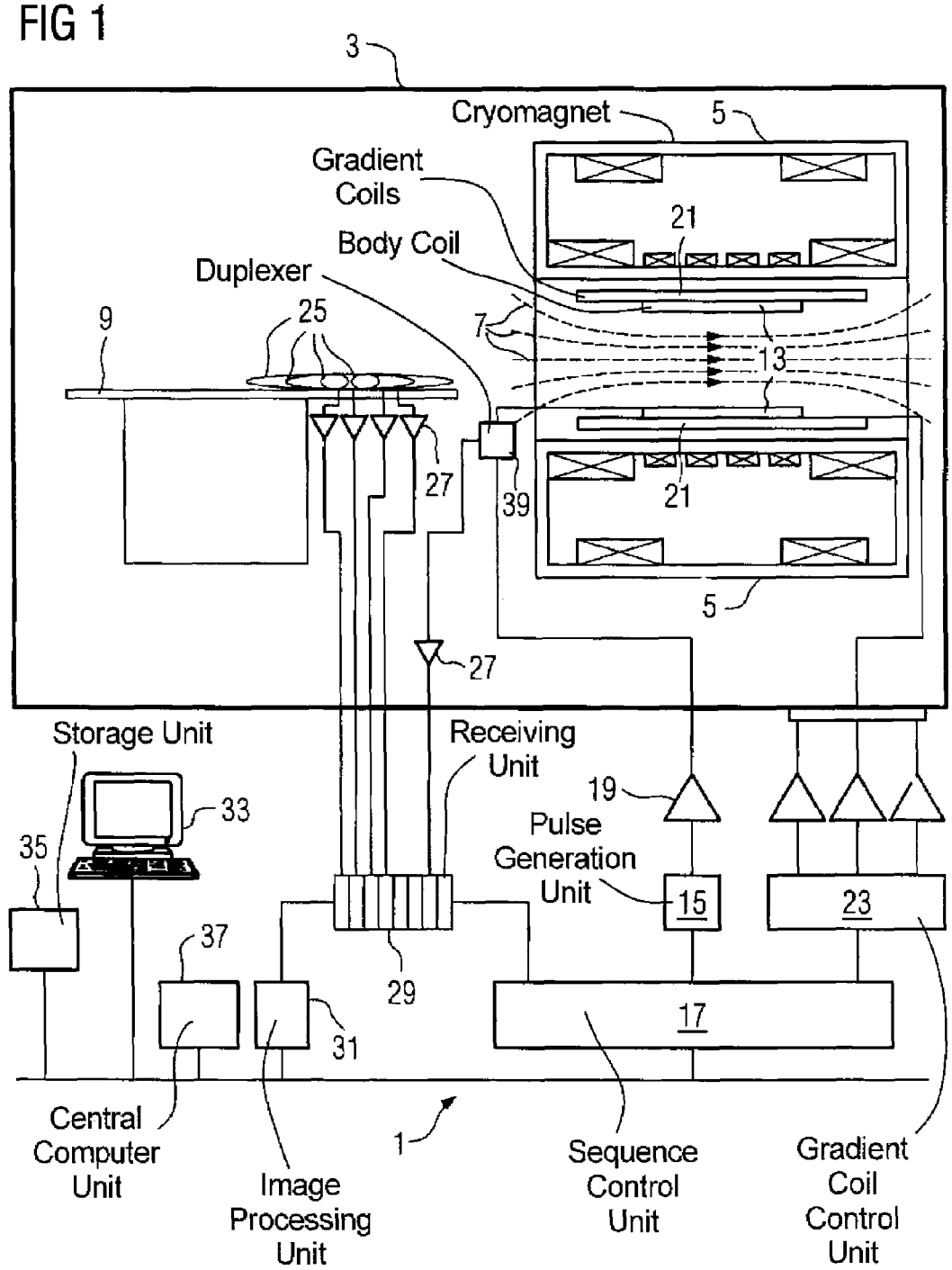
FIG. 1 shows a schematic overview of a MRI apparatus.

FIG. 1 schematically shows an apparatus 1 and its basic components. The design of the MRI apparatus 1 as presented here corresponds to a conventional MRI apparatus, with the important difference discussed below and encompasses variations and/or additions that can be made by those skilled in the art.

The MRI apparatus 1 is primarily used for examining a body by producing MR images of the interior of the body. For this purpose, different magnetic fields precisely matched in their temporal and spatial characteristics are applied.

A strong magnet, typically a cryomagnet 5 with a central opening, is arranged in an examination cabin 3 designed for shielding radio-frequency radiation. The cryomagnet 5 produces a strong static magnetic field 7, often also called main magnetic field, of typically 0.2 Tesla up to 3 Tesla and more.

A body or a part of the body, not shown, is positioned on a patient table 9. The part of the body which is to be examined is moved into a homogeneous region of the main magnetic field 7.

Nuclear spins in the body are excited by radio-frequency excitation pulses that are applied by a radio-frequency antenna, for example by the body coil 13. The radio-frequency pulses are produced by a pulse generation unit 15 which is controlled by a pulse sequence control unit 17. The radiofrequency pulses generated by the pulse generation unit 15 are amplified by a radio-frequency amplifier 19 and transmitted to the radio-frequency antenna. The radio-frequency system as shown here is only a schematic representation. Typically more than one pulse generation unit, radio-frequency amplifier and radio-frequency antenna is used in a MRI apparatus.

Furthermore, the MRI apparatus 1 has gradient coils 21 for applying magnetic gradient fields used for example for selective slice excitation or for spatial coding of the sampled signals. The gradient coils 21 are controlled by a gradient coil control unit 23. The gradient coil control unit 23 as well as to pulse generation unit 15 are connected to the pulse sequence control unit 17, which coordinates the radio-frequency pulses and the gradient fields necessary for applying a MRI pulse sequence.

Magnetic resonance signals originating from the excited nuclear spins are received by radio-frequency antennas, for example by the body coil 13 and/or local coils 25. The signals are amplified by a radio-frequency preamplifier 27 and digitized and/or further processed by a receiving unit 29.

Some radio-frequency antennas as e.g. the body coil 13 can be operated both in a transmission mode and in a reception mode. The correct signal path can be ensued by a duplexer 39 connected upstream of the radio-frequency antenna.

An image processing unit 31 produces images from the sampled signals. The reconstructed image can be displayed to a user at a user interface 33 or can be stored in a storage unit 35. A central computer unit 37 controls the various components of the MRI apparatus 1. The MRI apparatus 1 and, in particular, the central computer unit 37 and/or the pulse sequence control unit 17 are adapted for applying an MRI pulse sequence according to embodiments of the present invention.

Figure 2:
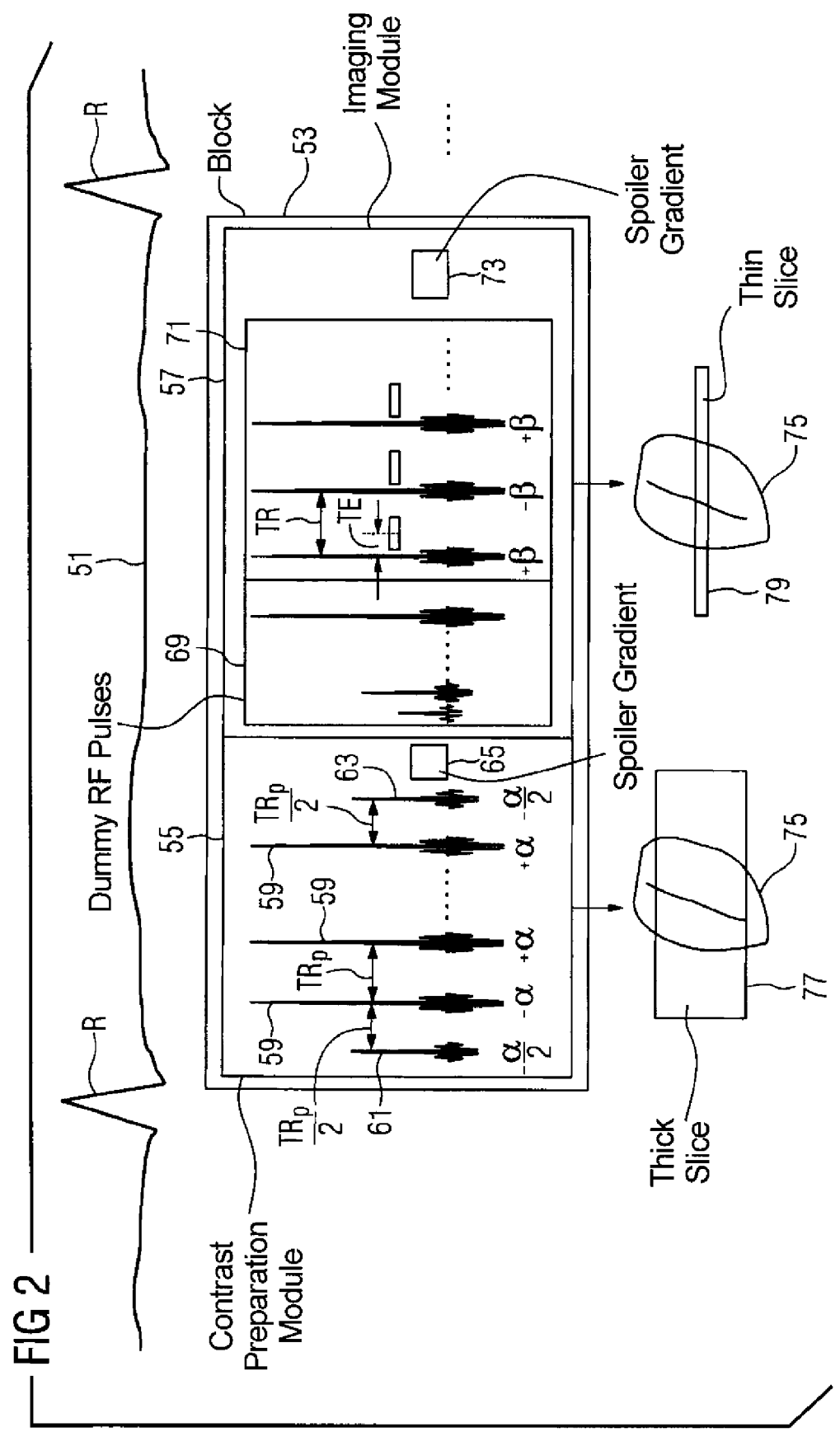
FIG. 2 shows a MRI pulse sequence diagram of an embodiment of the present invention.

FIG. 2 shows a MRI pulse sequence diagram of an embodiment of the present invention.

The sequence shown in FIG. 2 is adapted for cardiac imaging. The cardiac cycle is monitored by an electrocardiography signal 51. The R-wave R of the electrocardiography signal 51 is used as a trigger for starting one block 53 of the MRI pulse sequence.

One block 53 contains a contrast preparation module 55 followed by an imaging module 57. The contrast preparation module 55 which comprises a plurality of radio-frequency pulses and/or gradient pulses is used for preparing a contrast in the magnetization of the nuclear spins of the object which is to be examined.

For this purpose, the contrast preparation module 55 includes a train of radio-frequency pulses 59, which are all equally spaced in time and have the same flip angle magnitude. The sign of the flip angle is alternating from radiofrequency pulse 59 to radio-frequency pulse 59. The time interval between two radio-frequency pulses 59 is characterized by a repetition time $TR_P$. This train of radio-frequency pulses 59 prepares a contrast according to a steady-state free precession scheme; the contrast prepared exhibiting a T2/T1-weighting.

For cardiac imaging a repetition time of $TR_P=8$ ms and a flip angle of $=70°$ has proven to be useful on a 1.5 T MRI apparatus, especially for the detection of an acute infarct edemas, as has been shown by experiments for detection of a myocardial edema in canines. A myocardial ischemia also can be detected using a repetition time of $TR_P=8$ ms is used, as has been shown by experiments for detection of a myocardial ischemia in patients. Those skilled in the art, however, can easily change and adapt these values, particularly for achieving different contrast behavior. For example, if a longer $TR_P$ is used, the contrast will exhibit a more pronounced T2-weighting. If a shorter $TR_P$ is used, the T1-component of the T2/T1-weighted contrast will be more pronounced.

Prior to the train of radio-frequency pulses 59 a first radio-frequency pulse 61 having a flip angle with a magnitude of $\alpha/2$ is applied at a time interval of $TR_P/2$ before the first radio-frequency pulse of the train of radio-frequency pulses 59. This first radio-frequency pulse 61 reduces off resonance effects.

After a time interval of $TR_P/2$, the train of radio-frequency pulses 59 is succeeded by a second radio-frequency pulse 63 having a flip angle magnitude of $\alpha/2$. The second radio-frequency pulse 63 stores the prepared magnetization along the longitudinal axis, i.e. the direction defined by the static main magnetic field. The second radio-frequency pulse 63 is succeeded by a spoiler gradient 65 which destroys any remaining transverse magnetization.

The imaging module 57 succeeding the contrast preparation module 55 is used for acquiring magnetic resonance image data.

As shown in FIG. 2, the imaging module includes a first train of dummy radio-frequency pulses 69 which is applied before the acquisition 71 of magnetic resonance image data. Experiments showed that a train of eight dummy radio-frequency pulses 69 with a linearly increasing flip angle is particularly useful to reduce signal oscillations.

During the following data acquisition 71 a steady-state free precession acquisition scheme has been used. Typical useful sequence parameters are TR=3.2 ms, TE=1.6 ms, flip angle of 70°, field of view=178×300 mm² (phase×readout), matrix=152×256, bandwidth=975.0 Hz/pixel, 21 lines acquired per cardiac cycle. After image data acquisition a further spoiler gradient 73 destroys the remaining magnetization.

Although in FIG. 2 a steady-state free precession acquisition scheme for image data acquisition is shown, many other MRI data acquisition schemes known to those skilled in the art can be used in the imaging module 57.

As shown in the cardiac pictograms 75 at the bottom of FIG. 2, the contrast preparation module 55 is applied to a thick slice 77 of the object to be examined, whereas the succeeding imaging module 57 is applied to a thin slice 79 contained in the thick slice 77. This can be achieved e.g. by applying suitable adapted gradient pulses (not shown) for slice selection. For example, the thick slice 77 can have a thickness of 7 cm and the thin slice 79 can have a thickness of 1 cm.

All the nuclear spins of the thick slice 77 will exhibit the prepared contrast. Thus, even if some inflow of nuclear spins from the thick slice into the thin slice occurs when the imaging module 57 is applied, these nuclear spins will still exhibit the prepared contrast, thus improving the image quantity. A similar effect can be achieved when the contrast preparation module 55 is applied non-selectively.

After MRI data have been acquired with the MRI pulse sequence of the described embodiment, MR images can be reconstructed. The MR images are particularly useful for showing edema-containing regions of the heart muscle in particular when diagnosing an acute infarct or used to show ischemic regions of myocardium.

Although modifications and changes may be suggested by those skilled in the art, it is the intention of the inventor to embody within the patent warranted hereon all changes and modifications as reasonably and properly come within the scope of the inventor's contribution to the art.

I claim as my invention:

1. A magnetic resonance imaging method for acquiring magnetic resonance image data from an object, comprising the steps of:

preparing a contrast in magnetization of nuclear spins of an object by applying a contrast preparation module to the object by radiating a train of radio-frequency pulses into the object, each having a flip angle associated therewith with the same flip angle magnitude $\alpha$ and with respective mathematical flip angle signs that alternate from radio-frequency pulse to radio-frequency pulse in said train to produce a T2/T1 weighting of said nuclear spins; and acquiring magnetic resonance image data dependent on the contrast prepared by said contrast preparation module, by applying an imaging module to the object to obtain a magnetic resonance image dataset, and making said magnetic resonance image dataset available in a form for processing thereof.

2. A method as claimed in claim 1 comprising emitting radio-frequency pulses in said train with said flip angle magnitude $\alpha$ being different from 180°.

3. A method as claimed in claim 2 comprising emitting radio-frequency pulses in said train with said flip angle magnitude $\alpha$ in a range between 20° and 150°.

4. A method as claimed in claim 3 comprising emitting radio-frequency pulses in said train with said flip angle magnitude $\alpha$ in a range between 40° and 120°.

5. A method as claimed in claim 4 comprising emitting radio-frequency pulses in said train with said flip angle magnitude $\alpha$ in a range between 60° and 90°.

6. A method as claimed in claim 1 comprising emitting said radio-frequency pulses in said train equally spaced in time relative to each other.

7. A method as claimed in claim 1 comprising, in said contrast preparation module, preceding said train of radio-frequency pulses by emitting a first radio-frequency pulse.

8. A method as claimed in claim 7 comprising emitting said first radio-frequency pulse with a flip angle magnitude of $\alpha/2$.

9. A method as claimed in claim 1 comprising, in said contrast preparation module, following said train of radio-frequency pulses by emitting a flip back radio-frequency pulse.

10. A method as claimed in claim 9 comprising emitting said flip back radio-frequency pulse with a flip angle magnitude of $\alpha/2$.

11. A method as claimed in claim 1 comprising, at an end of said imaging module, emitting a spoiler gradient.

12. A method as claimed in claim 1 comprising, in said contrast preparation module, preceding said train of radio-frequency pulses by emitting a first radio-frequency pulse and following said train of radio-frequency pulses by emitting a flip back radio-frequency pulse, and ending said contrast preparation module by emitting a spoiler gradient.

13. A method as claimed in claim 12 comprising emitting said first radio-frequency pulse with a first flip angle magnitude of $\alpha/2$ and emitting said flip back radio-frequency pulse with a second flip angle magnitude of $\alpha/2$.

14. A method as claimed in claim 1 comprising applying said contrast preparation module to a first slice of a first thickness of said object, and applying said imaging module to a second slice of a second thickness of said object, said second thickness being smaller than said first thickness and said second slice being contained in said first slice.

15. A method as claimed in claim 14 comprising applying said contrast preparation module non-selectively.

16. A method as claimed in claim 1 comprising applying said imaging module as a steady-state free precession data acquisition pulse sequence.

17. A method as claimed in claim 1 comprising applying said imaging module by emitting a train of dummy radio-frequency pulses in said imaging module prior to applying pulses for acquiring said magnetic resonance image data.

18. A method as claimed in claim 17 comprising emitting said dummy radio-frequency pulses with respective flip angles that increase linearly.

19. A method as claimed in claim 1 comprising applying said contrast preparation module and said imaging module as a module block, and repeatedly applying said module block to said object multiple times.

20. A method as claimed in claim 19 wherein said object is a living subject, and comprising acquiring an electrocardiographic signal from said living subject and triggering application of each of said module blocks with said electrocardiographic signal.

21. A method as claimed in claim 1 comprising employing a pulse sequence in said imaging module configured for cardiac imaging.

22. A magnetic resonance imaging apparatus for acquiring magnetic resonance image data from an object, comprising:
   a magnetic resonance scanner configured to interact with an object to obtain magnetic resonance data therefrom, said magnetic resonance scanner comprising a gradient coil system and a radio-frequency antenna system;
   a control computer connected to said magnetic resonance scanner that operates said radio-frequency antenna to prepare a contrast in magnetization of nuclear spins of an object by causing said radio-frequency antenna to apply a contrast preparation module to the object by radiating a train of radio-frequency pulses into the object, each having a flip angle associated therewith with the same flip angle magnitude $\alpha$ and with respective mathematical flip angle signs that alternate from radio-frequency pulse to radio-frequency pulse in said train to produce a T2/T1 weighting of said nuclear spins; and
   said control computer further operating said radio-frequency antenna, and said gradient coil system to acquire magnetic resonance image data dependent on the contrast prepared by said contrast preparation module, by causing said radio-frequency antenna and said gradient coil system to apply an imaging module to the object to obtain a magnetic resonance image dataset, and making said magnetic resonance image dataset available in a form for processing thereof.

\* \* \* \* \*